(12) United States Patent
Gelorme et al.

(10) Patent No.: US 6,319,650 B1
(45) Date of Patent: Nov. 20, 2001

(54) HIGH RESOLUTION CROSSLINKABLE PHOTORESIST COMPOSITION, COMPATABLE WITH HIGH BASE CONCENTRATION AQUEOUS DEVELOPERS METHOD AND FOR USE THEREOF

(75) Inventors: Jeffrey Donald Gelorme, Plainville, CT (US); Ali Afzali-Ardakani, Yorktown Heights, NY (US); Teresita Ordonez Graham, Irvington, NY (US); Laura Louise Kosbar, Mohegan Lake, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/513,481

(22) Filed: Feb. 25, 2000

(51) Int. Cl.$^7$ ............................................. G03F 7/004
(52) U.S. Cl. ...................... 430/270.1; 430/914; 430/920; 430/927
(58) Field of Search ............................... 430/270.1, 927, 430/914, 920

(56) References Cited

U.S. PATENT DOCUMENTS 4,175,972 * 11/1979 Crivello ........................... 204/159.18
5,853,953 * 12/1998 Georger, Jr. ....................... 430/270.1
6,074,801 * 6/2000 Iwasa et al. ....................... 430/270.1
6,087,064 * 7/2000 Lin et al. ........................... 430/270.1
6,150,068 * 11/2000 Sato et al. ......................... 430/270.1

FOREIGN PATENT DOCUMENTS

1030615 * 11/1998 (JP) .
10306159 * 11/1998 (JP) .

OTHER PUBLICATIONS

Derwent abstract of JP 10306159, Nov. 1998.*
CAPLUS online abstract of JP 10306159, Nov. 1998.*

* cited by examiner

Primary Examiner—Rosemary Ashton
(74) Attorney, Agent, or Firm—Thomas A. Beck; Daniel P. Morris

(57) ABSTRACT

An improved, aqueous base developable, high resolution photoresist composition for use in deep UV and compatable with high base strength aqueous developers is disclosed. The composition of the present invention comprises of a phenolic functional methacrylate polymer resin, a crosslinker selected from glycoluril derivatives capable of reacting with there resins under acid catalysis, a photoacid generator and an organic solvent. The composition of the present invention is particularly useful for production of negative tone images of high resolution (less than 0.125 micrometer).

12 Claims, 2 Drawing Sheets

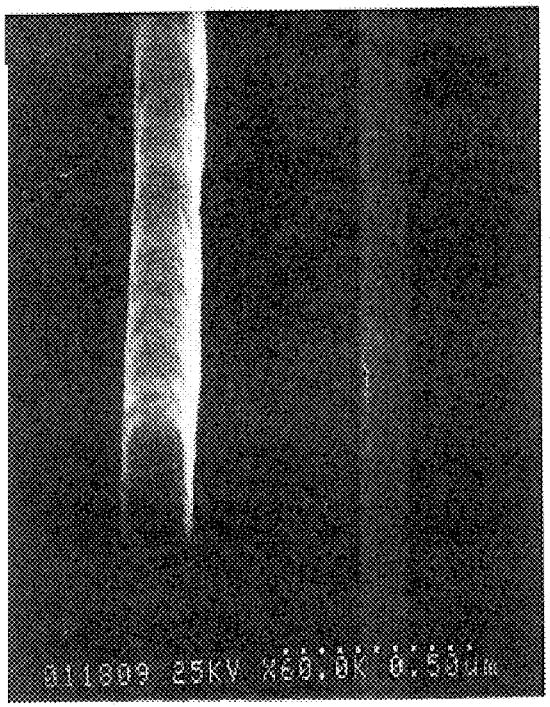
Fig. 1: 0.125 micron isolated line, 26.5 mj/cm²
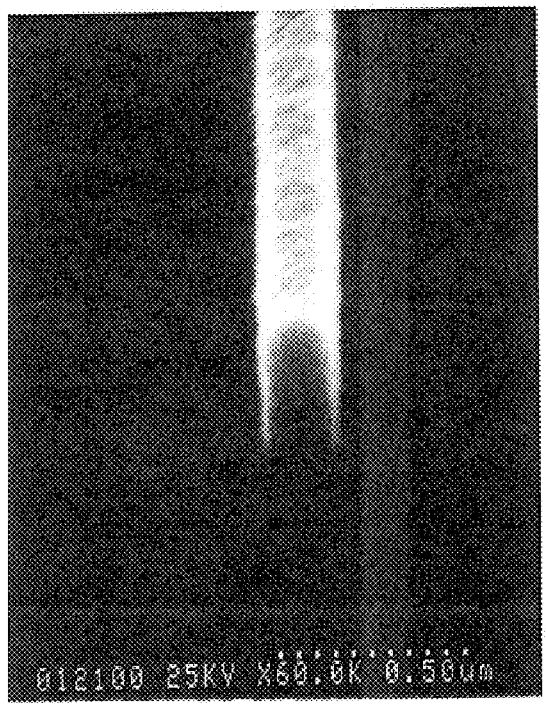
Fig. 2: 0.125 micron isolated line 29 mj/cm²

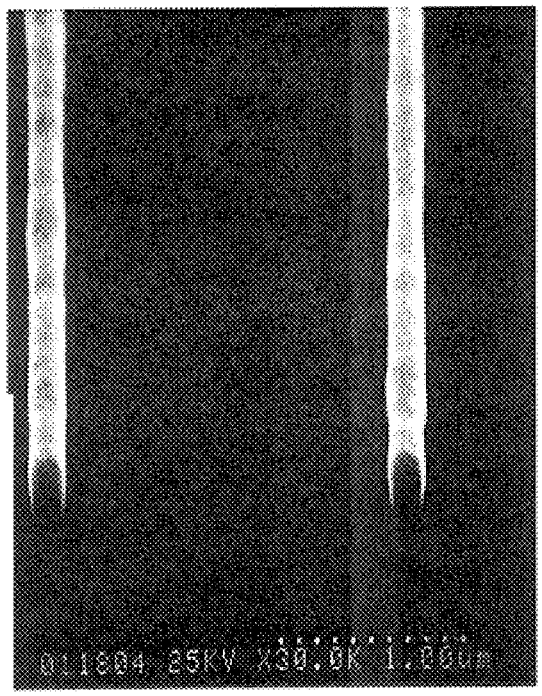
Fig. 3: 0.125 isolated lines 27.5 mj/cm²
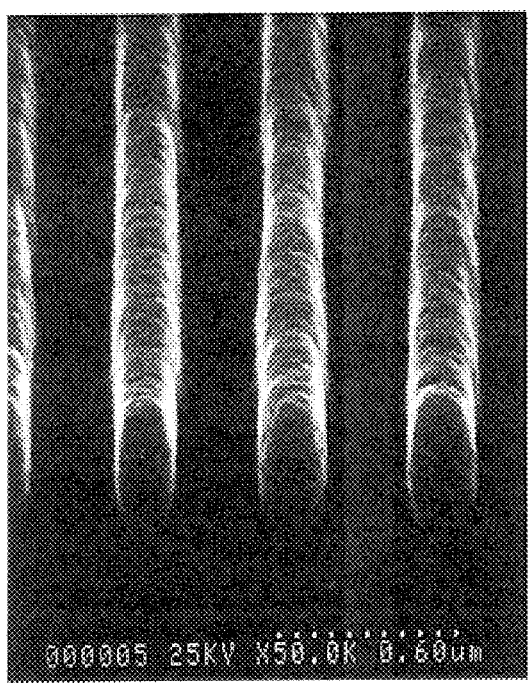
Fig. 4: 0.125 micron lines / 0.375 micron space array 28 mj/cm²

HIGH RESOLUTION CROSSLINKABLE PHOTORESIST COMPOSITION, COMPATABLE WITH HIGH BASE CONCENTRATION AQUEOUS DEVELOPERS METHOD AND FOR USE THEREOF

CROSS REFERENCE TO A RELATED APPLICATION

U.S. application Ser. No. 08/932,686, filed on Sep. 18, 1997, entitled "Crosslinkable, Aqueous Base Developable Photoresist Composition And Method For Use Thereof", is Incorporated herein by reference.

FIELD OF INVENTION

The present invention relates to strong aqueous base developable photoresist composition and processes for forming lithographic patterns therewith.

BACKGROUND OF INVENTION

There is continuing effort in electronic industry to achieve higher circuit density in electronic devices. To archive higher degree of integration, new and improved lithographic tools and techniques have been developed which in turn demand new photoresists that could enhance the resolution of lithographic patterns. Aqueous base developable photoresist compositions which are formed through crosslinking have been disclosed in Reck et al., SPIE regional Technical Conference on Photopolymers, Ellenville, N.Y., 63 (1988) and in U.S. Pat. No. 5,034,304 and 5,204,225 to Feely. Such formulations were characterized by polymers having an aromatic moeity, like poly(hydroxystyrene) or novolak, which are susceptible to electrophilic aromatic substitution, and a crosslinking agent which can form a carbonium ion upon treatment with acid and a photoacid generator.

U.S. Pat. No. 4,810,601 to Allen et al. is concerned with formation of negative tone resist patterns by crosslinking an aromatic compound with monomeric or polymeric source of carbonium ions. Thus, diacetoxymethyl benzene and trisacetoxymesitylene were used with triphenylsulfonium hexafluoroantimonate to crosslink a poly(hydroxystyrene) matrix.

U.S. Pat. No. 5,296,332 to Sachdev and Japanese patents 2-15270 and 1-293339 to Kokai describe aqueous base deviopable resist composition comprising of a phenolic resin like poly(hydroxystyrene) or Novolak, a crossinkable agent which can form carbonium ion upon treatment with acid, and a photoacid generator.

SUMMARY OF THE INVENTION

A broad aspect of this invention is an aqueous base developable photoresist composition for generating subquarter of micrometer negative tone resist images on a substrate. Another aspect of this invention is a photoresist composition which is capable of being developed in higher concentrations of base developer than polyhydroxystyrene resist compositions to be compatable with those used in positive tone resist manufacturing and does not result in the formation of microbridges between the resist image on the substrate. The composition of this photoresist consists of (a) a film forming polymer methacrylate resin having pendant phenolic groups, (b) an acid catalyzable crosslinking agents selected from aminoplast family and more particularly from glycoluril derivatives (c) a radiation degradable acid generator to assist in crosslinking of the film former and crosslinker and (d) optionally an organic base to improve shelf life stability of the formulation. The phenolic polymer resins of the present invention are selected from the unmodified homopolymers of Poly 4-Hydroxyphenylethyl methacrylate of molecular weights between 68–8K number average molecular weight as shown in the formula

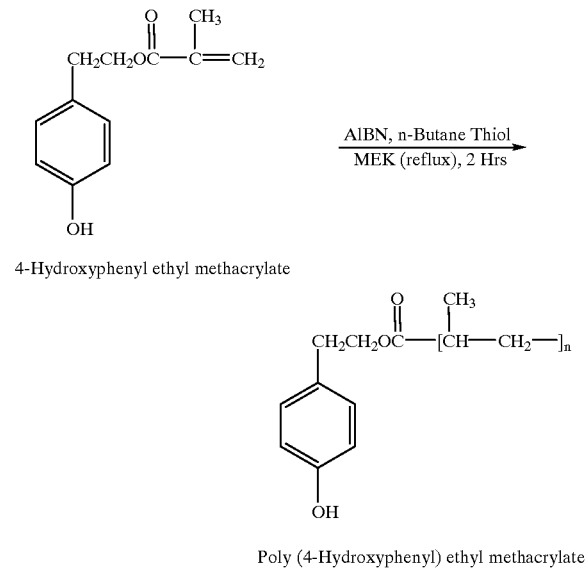

4-Hydroxyphenyl ethyl methacrylate

Poly (4-Hydroxyphenyl) ethyl methacrylate

The crosslinking agents of this composition are selected from Glycouril derivatives shown in the formula:

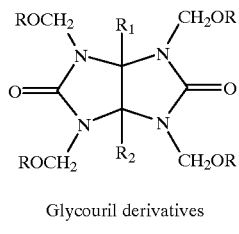

Glycouril derivatives in which R is an alkoxadical, preferably $CH_{20}CH_3$, and R1 and R2 can individually be selected from hydrogen, alkyl or aryl groups. The composition of the present invention also includes a radiation degradable acid generator.

The present invention also provides a method of using new resist composition for generating negative tone resist images on a substrate which comprises:
a) coating the substrate with a film comprising of a film forming polymer resin having phenolic functionality, an acid catalyzable crosslinking agent selected from glycoluril derivatives and a radiation degradable acid generator;
b) imagewise exposing the film with UV radiation to cause crosslinking in the exposed portion of the film;
c) baking the said substrate at elevated temperatures, and
d) developing film in an aqueous base developer.

The present compositions are sensitive to deep UV radiation. The resist speed can be adjusted by the ratio of the crosslinker to polymer resin, addition of an organic base.

BRIEF DESCRIPTION OF DRAWINGS

FIGS. 1–4 are photomicrographs showing images made using different compositions of the present invention.

DETAILED DESCRIPTION OF THE INVENTION

The present invention relates to high resolution, aqueous base developable photoresist compositions for generating negative tone images on a substrate. These compositions comprise (a) a film forming phenolic functional methacrylate resin having phenolic functionality (b) a glycoluril derivative crosslinker which upon acid catalysis can react with the phenolic functionality and form crosslinks, (c) a photodegradable acid generator which upon exposure to UV radiation forms the acid catalyst needed for the formation of the crosslinks and (d) an organic base like tetiary amines specifically added to increase the shelf life of the formulation and adjust the photospeed. The polymer resin is selected from poly 4-Hydroxyphenyl ethyl methacrylate of molecular weight of at least 6K Mn and most preferably between 6 and 8 k Mn as shown in the formula

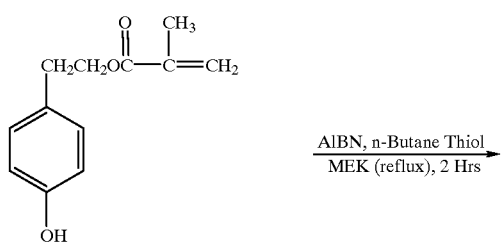

4-Hydroxyphenyl ethyl methacrylate

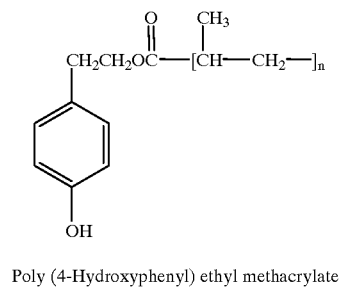

Poly (4-Hydroxyphenyl) ethyl methacrylate

Crosslinkers for the compositions of this invention are Glycoluril derivatives of general formula:

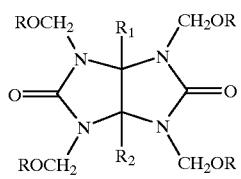

Glycouril derivatives in which R is an alkoxy, preferably CH2OCH3, and R1 and R2 can individually be selected from alkyl groups having 1–6 carbon atoms exemplified by (a) tetrakis-methoxymethyl-3a,6-diethylglycouril, (b) tetrakis-methoxymethyl-3a-methyl-6a-propylglycouril and (c) tetrakis-methoxymethyl-3a-methyl-6a-butylglycouril as shown in the following formula:

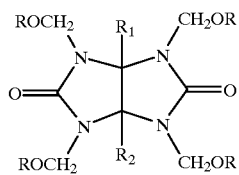

Glycouril derivatives

R1 and R2 can also be selected from alkyl and aryl group or hydrogen and aryl groups like (d) tetrakismethoxymethyl-3-phenylglycouril and formula:

(e) tetrakis-methoxymethyl-3a-methyl-6a-phenylglycouril as shown in the following formula:

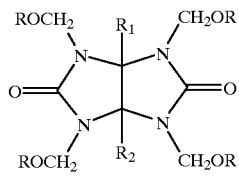

Glycouril derivatives

R1 and R2 both could be aryl groups like phenyl, furyl or alkylphenyl and halogenated aryl groups or substituted diphenylether groups as exemplified in the following formula (f)–(h):

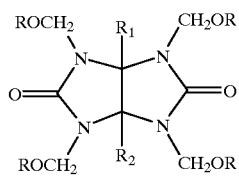

Glycouril derivatives

The composition of the present invention also preferably includes a photoacid generator (PAG) which can be selected from onium slats of Group IV elements as disclosed in U.S. Pat. No. 4,175,972 the teaching of which is incorporated herein by reference and aromatic onium salts of Group Va elements disclosed in U.S. Pat. No. 4,069,055 the teaching of which is incorporated herein by reference. Aromatic Group IVa onium salts include those represented by formula:

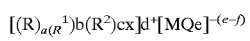

$[(R)_a(R^1)b(R^2)cx]d^+[MQe]^{-(e-f)}$ where R is a monovalent aromatic organic radical, $R^1$ is a monovalent organic aliphatic radical selected from alkyl, cycloalkyl and substituted alkyl, $R^2$ is a polyvalent organic radical forming a heterocyclic or fused ring structure x is a Group IVa element or metalloid, Q is a halogen radical, a is a whole number from 0 to 3 inclusive, b is a whole number from 0 to 2 inclusive and c is a whole number equal to 0 or 1. Radical included by R are, for example, (C6–C14) aromatic hydrocarbon radicals such as phenyl, tolyl, xylyl, naphthyl, anthryl and radicals substituted with up to 1 to 4 monovalent raducals such as C(1–8) alkyl, C(1–8) alkoxy, nitro, chloro, fluoro, and hydroxy; arylacyl radicals such as phenylacetyl; aromatic heterocyclic radical such as pyridyl and furyl; $R^1$ radical include C(1–8) alkyl, substituted alkyl such as —C2H4OCH3, —CH2-COCH3, etc. $R^2$ radicals include structures such as:

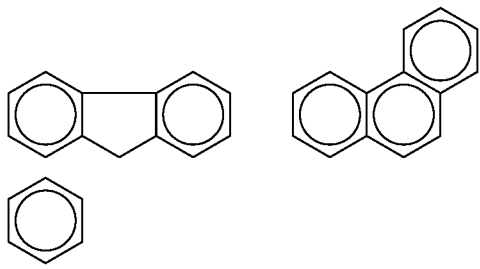

Complex anions included by $MQe^{-(e-f)}$ of above formula are, for example. $BF4^-$, $PF6^-$, $SbF6^-$, $FeCl4^-$, $SnCl6^-$, $SbCl6^-$, $BiCl5^-$, $AlF6^{-3}$, $GaCl4^-$, $InF4^-$ etc.

Group VIa onium salts included by above formula are, for example:

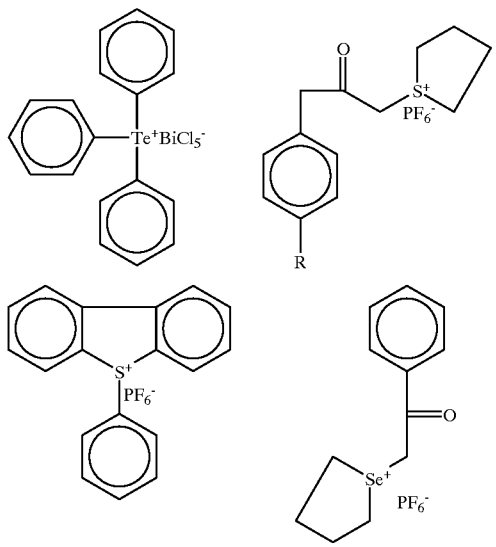

Among non-metallic radiation degradable acid generators suitable for use in compositions of this invention are N-sulfonyloxyimides of the form:

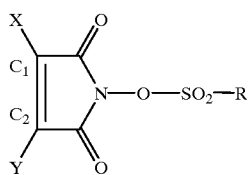

where R is selected from the group consisting of toluene, benzene, CF3, CF2CF3, -(CF2)n-Z where n=1 to 4 and Z is H or alkyl or aryl and where X and Y either (1) form polycyclic ring which may or may not contain heteroatom, or (2) form a fused aromatic ring or (3) may be independently H, alkyl or aryl group and C1 and C2 may form a single or double bond. The composition of the present invention also contains small amounts of a basic compounds chosen from any organic amines, specially from tertiary amines. The compositions of the present invention are preferably carried in a solvent or solvent system. The solvent or solvent system used in carrying these compositions preferably fulfills the need for providing uniform coating with complete coverage of the resist components on the substrate. The solvent preferably evaporates at temperature such that the photoactivity of the resist is not adversely impacted upon a drying step and will not take part in the operation of the photoresist (to be inert toward phenolic resin and/or crosslinker). Typical of these solvents are propyleneglycol monomethyl ether acetate (PGMEA), ethyl-3-ethoxypropionate (EEP), methoxypropanol, ethoxypropanol, butoxypropanol and ethyl lactate.

For formation of the negative tone image, the composition of the present invention is applied (for example, by spin-coating) on a substrate and the remaining solvent is evaporated by heating the substrate on a hot plate to temperatures of about 70–130 C for 1–3 minutes. The film is then imagewise exposed to UV radiation with wavelength of about 200–370 nm upon which the radiation degradable component of the composition degrades and forms catalytic amount of acid. The crosslinking reaction between phenolic resin and crosslinker is then accelerated by heating the substrate from 70–110 C for preferably one to three minutes. The images are thus rendered less soluble or insoluble in aqueous base and in the developing stage, the unexposed areas are removed by aqueous base like dilute solution of tetramethylammonium hydroxide (TMAH).

In another embodiment of this invention, the glycoluril derivatives which are used as crosslinkers are synthesized from corresponding dicarbonyl compounds as described. Glycoluril derivative of this invention are highly soluble in the organic solvent of the choice, and compared to unsubstituted glycouril, they cause lowering of dissolution rate of the final composition in the base developer.

General Procedure for Preparation of Alkyl-substituted Gycolurils.

Synthesis of alkyl-substituted glycolurils is exemplified by the synthesis of 3a-methyl-6a-propylglycoluril described below.

2,3-hexandione (1.0 mole) and urea (3.0 mole) were added to 2.0 liters of 2% hydrochloric acid and the solution is stirred at room temperature for 24 hours (alternatively, the solution could be refluxed for 2–3 hours). The precipitate is filtered and washed with water and then ethanol and dried. The off-white powder is then crystallized in acetic acid to give analytically pure tite compound in 45% yield.

General Procedure for Preparation of Aryl-substituted Glycolurils.

The appropriate benzil derivative (Schem I, R1 and R2 are aryl groups or combination of alkyl and aryl groups) (1.0 mole) and urea (0.3 mole) is suspended in 300 mL of toluene and 5.0 mL of trifluoroacetic acid is added. The resulting solution is refluxed for 8 hours, during which water is removed through a Dean-Stark trap. The solution is cooled to room temperature and the crystalline material which precipitated is filtered and washed with toluene and then hexane and dried.

Hydroxmethylation of Glycolurils.

The glycoluril derivative (0.10 mole) is suspended in 37% aqueous formaldehyde solution (0.5 mole) and the pH is adjusted to 10–11 with addition of 10% sodium hydroxide. The resulting mixture is heated at 50 C for 24 hours after which all the solids are dissolved in the solution. The solution is cooled to room temperature and water is removed under reduced pressure. The residue (either solid or gummy material) is used in the next step without further purification.

Etherification of aminoplast compounds.

Tetrakis-hydroxymethyl glycolurils are converted to their corresponding tetramethoxymethyl derivative by suspending in excess of 2,2-dimethoxypropane, few drops of concentrated hydrochloric acid is then added and the mixture is stirred at room temperature for 24 hours. The solvent is removed under reduced pressure and the residue is either crystallized from appropriate solvent (as in the case of diaryl or alkyl aryl substituted glycolurils) or the oily residue is distilled under high vacuum and high temperature (e.g., in the case of methyl propyl or methyl butyl etc.) to give desired tetrakis-methoxymethyl derivative of glycolurils.

The following examples are detailed description of methods of preparation and use of the process of the present invention. The detailed preparations fall within the scope of, and serve to exemplify, the more generally described methods set forth above. The examples are presented for illustrative purposes only, and are not intended to restrict or limit the scope of the invention.

EXAMPLE I

Poly4-HYDROXYPHENYL ETHYL METHACRYLATE OF Mn=7K, (8 Gram) and 3a-methyl-6a-propyletrakis-methoxymethylglycoluril (1.0 gram) and MDT (trifluoromethylsulfonyloxybicyclo[2.2.1]hept-5-ene-2,3-dicarboximide) (1.00 GRAM) are dissolved in 50 mL of propyleneglycol monomethyl ether acetate (PGMEA). The resulting solution is filtered through 0.25 micron filter and spin coated on a substrate. After baking for one minute at 95 C1, it is exposed with ca. 25 mj/cm² of 248 nm UV light using a 0.6 NA 248 nm step and repeat tool. After post exposure bake at 110 for 1 minute, the photoresist is developed in 0.26 N aqueous tetramethyl ammonium hydroxide. High resolution images (FIGS. 1–4) with well defined 0.125 um lines are formed.

What is claimed is:

1. A method of forming a pattern of photoresist which comprises:
   providing on a substrate an uncured film comprising a poly(4-hydroxyphenylethyl methacrylate phenolic functional resin of at least 6K number average molecular weight, a glycoluril derivative having the general formula:

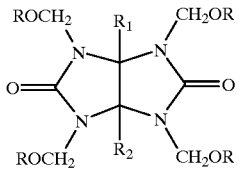

Glycouril derivatives in which $R_1$, and $R_2$ can be selected individually from the group consisting of alkyls having 1–6 carbons, alkenyls, alkoxy, aryls selected from the group consisting of phenyl, furyl, and thienyl, alkylaryls selected from the group consisiting of tolyl, xylyl, mesityl or $C_nH_{2n+1}C_6H_4$— where n can be from 3–6, halogenated aryls, diphenyl ether and diphenylsulfide;
   a photoacid generator; an organic solvent; imagewise exposing said film to ultraviolet light having a wavelength of from about 250 to 370 nanometers in a pattern to thereby cause generation of acid catalyst in said pattern; baking said exposed film at 90–130° C. for 1–2 minutes; and developing said photoresist in aqueoux, base solution.

2. The method according to claim 1 wherein said photoacid generator is selected from onium salts of Group VIa elements.

3. The method according to claim 1 wherein said photoacid generator is selected from aromatic oniurm salts of Group Va elements.

4. A method according to claim 1 wherein said photoacid generator is selected from sulfonate of N-hydroxyimides.

5. The method according to claim 1 wherein said photoacid generator is the sulfonate of the following structure:

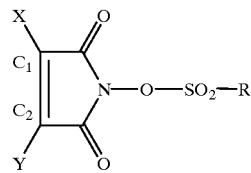

wherein R is selected from the group consisting of benzene, toluene, $CF_3$, $CF_2CF_3$; —$(CF_2)$—Z where n=1 to 4; Z is H or alkyl or aryl; where X and Y either (1) form a polycyclic ring which may or may not contain a heteroatom; or (2) form a fused aromatic ring or (3) may be independently H, alkyl or aryl group and $C_1$ and $C_2$ may form a single or double bond.

6. A method according to claim 1 wherein said phenolic resin or polymer, said glycoluril derivative said photoacid generator and said solvent form an ad mixture comprising:
   from about 90% to about 60% of said phenolic resin or polymer, from about 5% to about 20% of said glycoluril derivative, and from about 2% to about 20% of said photoacid generator and from about 0.02% to 0.5% of an organic base.

7. A method of forming a pattern of photo resist which comprises:
   a film of an admixture comprising: a poly(4-hydroxyphenylethyl methacrylate phenolic resin;
   a glycoluril derivative having the general formula:

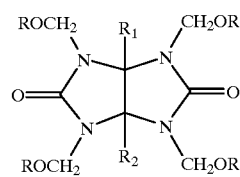

Glycouril derivatives in which $R_1$ and $R_2$ can be selected individually iiom the group consisting of alkyls having 1–6 carbons, alkenyls, alkoxy, aryls selected from the group consisting of phenyl, furyl, and thienyl, alkylaryls selected from the group consisiting of tolyl, xylyl, mesityl or $C_nH_{2n+1}C_6H_4$-where n can be from 3–6, halogenated aryls, diphenyl ether and diphenylsulfide; a photoacid generator; an organic solvent; an organic base; imagewise exposing said film to ultraviolet light in a pattern to thereby cause generation of acid catalyst in said pattern; baking of said exposed film; and developing said photoresist in an aqueous developer of at least 0.26N concentration.

8. A composition of matter comprising an admixture of a poly(4-hydroxyphenylethyl methacrylate phenolic resin;

a glycoluril derivative having the general formula:

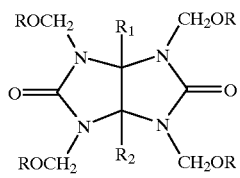

Glycouril derivatives in which $R_1$ and $R_2$ can be selected individually from the group consisting of alkyls having 1–6 carbons, alkenyls, alkoxy, aryls selected from the group consisting of phenyl, furyl, and thienyl, alkylaryls selected from the group consisiting of tolyl, xylyl, mesityl or $C_nH_{2n+1}C_6H_4$-where n can be from 3–6, halogenated aryls, diphenyl ether and diphenylsulfide;

a photoacid generator; an organic solvent; an organic base.

9. The composition according to claim 8 wherein said photoacid generator is selected from aromatic onium salts of Group Va elements.

10. The composition according to claim 8 wherein said photoacid generator is selected from onium salts of Group VIa elements.

11. The method according to claim 8 wherein said photoacid generator is selected from sulfonate of N-hydroxyimides.

12. The method according to claim 8 wherein said phenolic resin, said glycoluril derivative, said photoacid generator and said solvent form an admixture comprising from about 40% to about 80% os said phenolic resin, from about 5% to about 25% of said glycoluril derivative and from about 2.0% to about 20% of said photoacid generator and from about 0.01% to about 0.5% of an organic base.

* * * * *